United States Patent
Jung (10) Patent No.: US 9,425,222 B2
(45) Date of Patent: Aug. 23, 2016

(54) DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Hyunggi Jung, Chungcheongnam-do (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 25 days.

(21) Appl. No.: 14/472,465

(22) Filed: Aug. 29, 2014

(65) Prior Publication Data
US 2015/0198843 A1    Jul. 16, 2015

(30) Foreign Application Priority Data
Jan. 15, 2014 (KR) .................... 10-2014-0005126

(51) Int. Cl.
| | | |
|---|---|---|
| G02F 1/1333 | (2006.01) | |
| H01L 27/12 | (2006.01) | |
| G02F 1/1343 | (2006.01) | |
| G02F 1/1339 | (2006.01) | |
| G02B 5/20 | (2006.01) | |
| G02F 1/1362 | (2006.01) | |

(52) U.S. Cl.
CPC ............ *H01L 27/1259* (2013.01); *G02B 5/201* (2013.01); *G02F 1/13394* (2013.01); *G02F 1/13439* (2013.01); *G02F 1/136209* (2013.01); *H01L 27/124* (2013.01); *G02F 2001/13398* (2013.01); *G02F 2001/133388* (2013.01); *G02F 2001/136218* (2013.01)

(58) Field of Classification Search
CPC .................... G02F 1/133514; G02F 1/133512; G02F 1/133516; G02F 1/136209; G02F 2001/136218; G02F 1/133345; G02F 2001/136222

USPC .......................................... 349/106, 110, 138
See application file for complete search history.

(56) References Cited

U.S. PATENT DOCUMENTS

| | | | |
|---|---|---|---|
| 2004/0207321 A1 | 10/2004 | Nishikawa et al. | |
| 2008/0136992 A1* | 6/2008 | Kim .................. | G02F 1/133514 349/48 |
| 2009/0251631 A1 | 10/2009 | Kim et al. | |
| 2010/0123845 A1* | 5/2010 | Kim ...................... | H01L 27/124 349/46 |
| 2011/0051057 A1* | 3/2011 | Song ..................... | G02F 1/1393 349/106 |
| 2011/0216276 A1 | 9/2011 | Yang et al. | |
| 2015/0168772 A1 | 6/2015 | Jung et al. | |

FOREIGN PATENT DOCUMENTS

| | | |
|---|---|---|
| KR | 1020030050577 | 6/2003 |
| KR | 1020050116032 | 12/2005 |
| KR | 1020110027986 | 3/2011 |
| KR | 1020150070776 | 6/2015 |

* cited by examiner

*Primary Examiner* — Thanh-Nhan P Nguyen
(74) *Attorney, Agent, or Firm* — F. Chau & Associates, LLC (57) ABSTRACT

A display device includes pixels. At least one of the pixels includes a pixel area, a first non-pixel area disposed adjacent to the pixel area and extending in a first direction, and a second non-pixel area extending in a second direction substantially perpendicular to the first direction. The pixel including a pixel area includes a pixel electrode disposed in the pixel area, a color filter extending in the second direction, and a shielding electrode extending in the second direction and disposed on the color filter in the second non-pixel area. A capping layer is disposed on the color filter. The capping layer covers the shielding electrode in an area except for a crossing area where the first and second non-pixel areas cross each other. A black matrix is disposed on the capping layer and the shielding electrode in the first non-pixel area.

19 Claims, 11 Drawing Sheets

DISPLAY DEVICE AND METHOD OF MANUFACTURING THE SAME

CROSS-REFERENCE TO RELATED APPLICATION

This U.S. non-provisional patent application claims priority under 35 U.S.C. §119 to Korean Patent Application No. 10-2014-0005126, filed on Jan. 15, 2014, the disclosure of which is incorporated by reference herein in its entirety.

1. Technical Field

Exemplary embodiments of the present invention relate to a display device, and more particularly to a method of manufacturing the same.

2. Discussion of Related Art

A display device may include gate lines for receiving gate signals, data lines for receiving data voltages, pixels connected to the gate lines and the data lines, and color filters for providing color to the pixels.

Each of the pixels may receive a data voltage through a corresponding data line of the data lines in response to a gate signal provided through a corresponding gate line of the gate lines. The pixels may display gray scales corresponding to the data voltages. The color filters may provide color to light passing through the pixels. Thus, desired images may be displayed through the pixels.

SUMMARY

Exemplary embodiments of the present invention provide a display device, which can reduce a step difference of a black matrix and prevent deterioration of fluidity of a liquid crystal and reduce deterioration of a shock absorbing property of a display panel.

Exemplary embodiments of the present invention provide a method of manufacturing the display device.

Exemplary embodiments of the present invention provide a display device including a plurality of pixels. At least one of the pixels includes a pixel area, a first non-pixel area disposed adjacent to the pixel area and extending in a first direction, and a second non-pixel area extending in a second direction substantially perpendicular to the first direction. The pixel including the pixel area includes a pixel electrode disposed in the pixel area, a color filter extending in the second direction, and a shielding electrode extending in the second direction and disposed in the second non-pixel area on the color filter. A capping layer is disposed on the color filter. The capping layer covers the shielding electrode in an area except for a crossing area where the first non-pixel area crosses the second non-pixel area. A black matrix is disposed on the capping layer and the shielding electrode in the first non-pixel area.

The color filter may overlap with an adjacent color filter in the second non-pixel area.

A sum of heights of the overlapping color filters may be greater than a height of the color filter extending in the second direction by a first step difference.

The display device may include a black column spacer disposed on the black matrix in the first non-pixel area except for the crossing area. The black matrix may be disposed in the crossing area and may have a first height by the first step difference. The black column spacer may have a second height greater than the first height.

The display device may include a transistor connected to the pixel electrode. A gate line may extend in the first direction. The gate line may be disposed in the first non-pixel area, and may be connected to the transistor. A data line may extend in the second direction. The data line may be disposed in the second non-pixel area, and may be connected to the transistor. A contact hole may penetrate through the color filter and the capping layer. The color filter may be disposed on the transistor. The pixel electrode may be disposed on the capping layer, and the pixel electrode may be connected to the transistor through the contact hole.

The shielding electrode may have a width in the first direction, which is greater than a width of the data line. The shielding electrode may overlap with the second non-pixel area.

The capping layer may have a thickness of about 0.35 μm.

The display device may include a first substrate on which the pixels are disposed and a second substrate disposed to face the first substrate. The second substrate may include a common electrode facing the pixel electrode. A liquid crystal layer may be interposed between the first substrate and the second substrate.

The shielding electrode may receive a same voltage as a voltage applied to the common electrode.

The pixel electrode, the shielding electrode, and the common electrode may include a transparent conductive material.

Exemplary embodiments of the present invention provide a method of manufacturing a display device, which includes forming a plurality of pixels. At least one of the plurality of pixels includes a pixel area, a first non-pixel area disposed adjacent to the pixel area and extending in a first direction, and a second non-pixel area extending in a second direction substantially perpendicular to the first direction. The pixel including a pixel area is formed by forming a color filter extending in the second direction, forming a shielding electrode extending in the second direction and disposed on the color filter in the second non-pixel area, and forming a capping layer on the color filter to cover the shielding electrode. The capping layer is removed in a crossing area in which the first and second non-pixel areas cross each other. A black matrix is formed on the capping layer and the shielding electrode in the first non-pixel area. A pixel electrode is formed on the capping layer in the pixel area.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION

It will be understood that when an element or layer is referred to as being "on", "connected to" or "coupled to" another element or layer, it can be directly on, connected or coupled to the other element or layer or intervening elements or layers may be present. Like reference numbers may refer to like elements throughout the specification and drawings.

As used herein, the singular forms, "a", "an" and the are intended to include the plural forms as well, unless the context clearly indicates otherwise. Hereinafter, exemplary embodiments of the present invention will be described in more detail with reference to the accompanying drawings.

Figure 1:
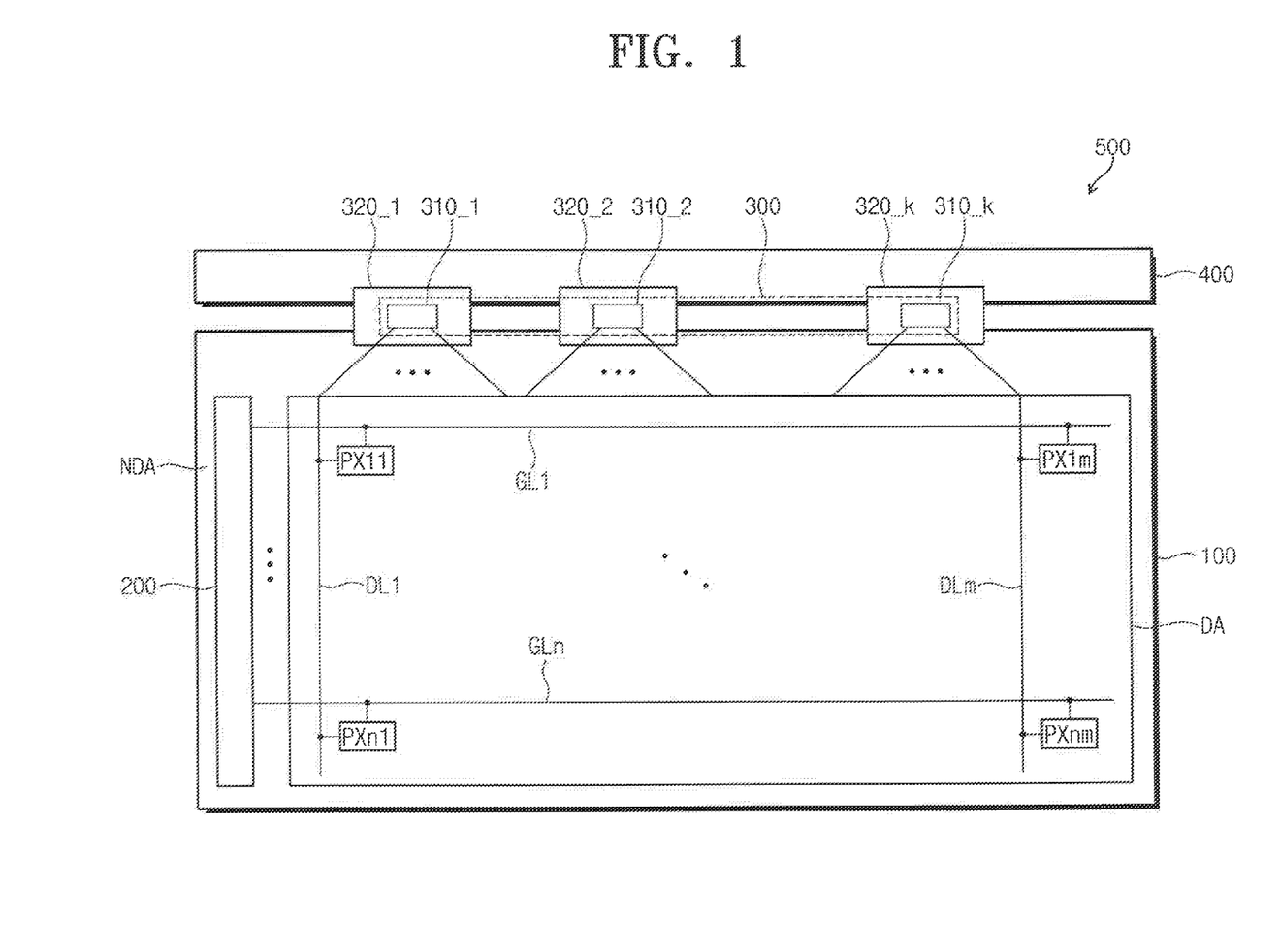
FIG. 1 is a plan view showing a display device according to an exemplary embodiment of the present invention.

FIG. 1 is a plan view showing a display device according to an exemplary embodiment of the present invention.

Referring to FIG. 1, a display device 500 according to an exemplary embodiment of the present invention may include a display panel 100, a gate driver 200, a data driver 300, and a driving circuit board 400.

The display panel 100 may include a plurality of pixels PX11 to PXnm, a plurality of gate lines GL1 to GLn, and a plurality of data lines DL1 to DLm. The display panel 100 may include a display area DA and a non-display area NDA surrounding the display area DA when viewed in a plan view.

The pixels PX11 to PXnm may be arranged in a matrix form and may be disposed in the display area DA. For example, the pixels PX11 to PXnm may be arranged in n rows by m columns crossing each other. Each of "n" and "m" is an integer number greater than zero (0).

The gate lines GL1 to GLn may be insulated from the data lines DL1 to DLm where the gate lines GL1 to GLn cross the data lines DL1 to DLm. The gate lines GL1 to GLn may be connected to the gate driver 200 and may sequentially receive gate signals. The data lines DL1 to DLm may be connected to the data driver 300 and may receive data voltages in analog form.

Each of the pixels PX11 to PXnm may be connected to a corresponding gate line of the gate lines GL1 to GLn and a corresponding data line of the data lines DL1 to DLm. Each of the pixels PX11 to PXnm may receive the data voltage through the corresponding data line of the data lines DL1 to DLm in response to the gate signal applied through the corresponding gate line of the gate lines GL1 to GLn. The pixels PX11 to PXnm may display gray scales corresponding to the data voltages.

The gate driver 200 may generate the gate signals in response to a gate control signal applied from a timing controller (not shown) disposed on the driving circuit board 400. The gate signals may be sequentially applied to the pixels PX11 to PXnm through the gate lines GL1 to GLn according to the row of the pixels. Thus, the pixels PX11 to PXnm may be driven as a unit according to the row of the pixels.

The gate driver 200 may be disposed in the non-display area NDA disposed adjacent to a left side of the display area DA. The gate driver 200 may be disposed on the non-display area NDA disposed adjacent to the left side of the display area DA. The gate driver 200 may include an amorphous silicon thin film transistor (TFT) gate driver circuit (ASG).

The gate driver 200 should not be limited thereto or thereby. In other words, the gate driver 200 may include a plurality of gate driving chips. The gate driving chips may be disposed on the non-display area NDA disposed adjacent to the left side of the display area DA using a chip on glass (COG) technique. The gate driving chips may be connected to the non-display area NDA disposed adjacent to the left side of the display area DA. The gate driving chips may include a tape carrier package (TCP) chip.

The data driver 300 may receive image signals and a data control signal from the timing controller. The data driver 300 may generate the data voltages in analog form, which may correspond to the image signals, in response to the data control signal. The data driver 300 may apply the data voltages to the pixels PX11 to PXnm through the data lines DL1 to DLm.

The data driver 300 may include a plurality of source driving chips 310_1 to 310_k, "k" is an integer number greater than zero (0) and smaller than "m". Each of the source driving chips 310_1 to 310_k may be disposed on a corresponding flexible circuit board of flexible circuit boards 320_1 to 320_k. Each of the source driving chips 310_1 to 310_k may be connected between the driving circuit board 400 and the non-display area NDA disposed adjacent to an upper portion of the display area DA. In other words, the data driver 300 may be connected to the display panel 100 using a tape carrier package (TCP) technique.

However, the data driver 300 should not be limited thereto or thereby. In other words, the source driving chips 310_1 to 310_k may be disposed on the non-display area NDA disposed adjacent to the upper portion of the display area DA using the chip on glass (COG) technique.

Figure 2:
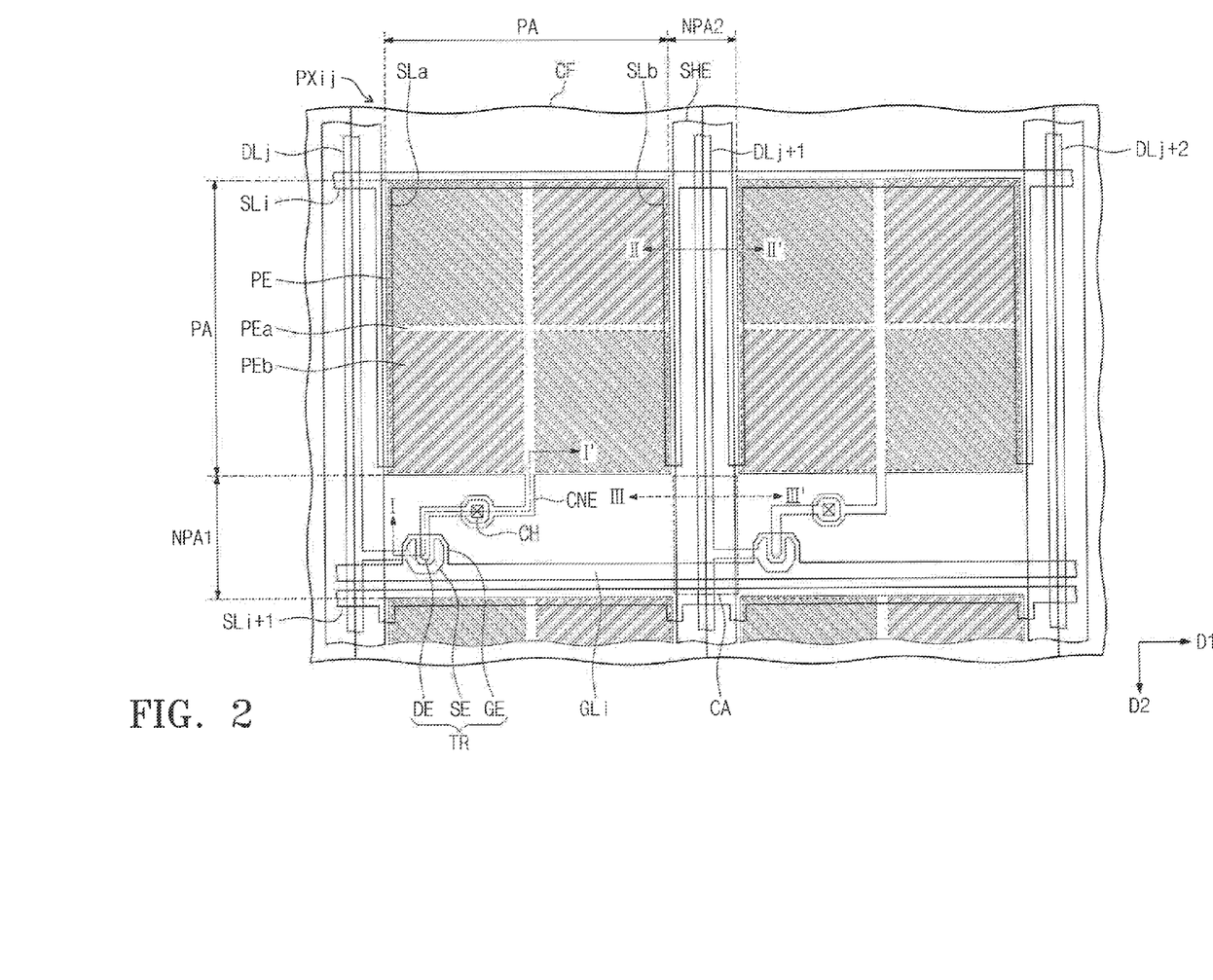
FIG. 2 is a plan view showing pixels shown in FIG. 1.

FIG. 2 is a plan view showing pixels shown in FIG. 1.

FIG. 2 shows two exemplary pixels. However, other pixels shown in FIG. 1 may have the same circuit configuration as the two pixels shown in FIG. 2. Pixel PXij shown in FIG. 2 will be described in more detail below.

Referring to FIG. 2, the pixel PXij may include a pixel area PA and non-pixel areas NPA1 and NPA2 disposed adjacent to the pixel area PA when viewed in a plan view. An image may be displayed through the pixel area PA and not through the non-pixel areas NPA1 and NPA2.

The non-pixel areas NPA1 and NPA2 may include a first non-pixel area NPA1 and a second non-pixel area NPA2. The first non-pixel area NPA1 may extend in a first direction D1. The second non-pixel area NPA2 may extend in a second direction D2 substantially perpendicular to the first direction D1. The first direction D1 may be a row direction and the second direction D2 may be a column direction.

The first non-pixel area NPA1 may be disposed between pixel areas PA in the second direction D2 and may extend in the first direction D1. The second non-pixel area NPA2 may be disposed between the pixel areas PA in the first direction D1 and may extend in the second direction D2. An area where the first non-pixel area NPA1 and the second non-pixel area NPA2 cross each other may be referred to as a crossing area CA.

The pixel PXij may be connected to a corresponding gate line GLi and a corresponding data line DLj. The pixel PXij may include a transistor TR connected to the corresponding gate line GLi and the corresponding data line DLj and a pixel electrode PE connected to the transistor TR. "i" is an integer number greater than zero (0) and equal to or smaller than "n". "j" is an integer number greater than zero (0) and equal to or smaller than "n".

The transistor TR may be disposed in the first non-pixel area NPA1. The pixel electrode PE may be disposed in the pixel area PA. The gate line GLi extends in the first direction D1 and may be disposed in the first non-pixel area NPA1. The data line DLj may extend in the second direction D2 and may be disposed in the second non-pixel area NPA2. The data line DLj may be insulated from the gate line GLi where the data line DLj crosses the gate line GLi.

The transistor TR may include a gate electrode GE connected to the gate line GLi, a source electrode SE connected to the data line DLj, and a drain electrode DE connected to the pixel electrode PE.

The gate electrode GE of the transistor TR may be branched from the gate line GLi. The source electrode SE may be branched from the data line DLj. The drain electrode DE may be electrically connected to the pixel electrode PE through a contact hole CH.

The pixel electrode PE may be electrically connected to the drain electrode DE of the transistor TR through the contact hole CH. A connection electrode CNE branched from the pixel electrode PE may be connected to the drain electrode DE of the transistor TR through the contact hole CH. The connection electrode CNE may be disposed in the first non-pixel area NPA1.

The transistor TR may be turned on in response to the gate signal provided through the gate line GLi. The turned-on transistor TR may receive a data voltage from the data line DLj and may apply the data voltage to the pixel electrode PE.

The pixel PXij may include a storage electrode part. The storage electrode part may include a storage line SLi, a first branch electrode SLa, and a second branch electrode SLb, which may be partially overlapped with the pixel electrode PE.

The storage line SLi may extend in the first direction D1 and may face the corresponding gate line GLi such that the pixel area PA is interposed between the storage line SLi and the gate line GLi. The storage line SLi may be disposed in an upper portion of the pixel area PA, and the gate line GLi may be disposed in the first non-pixel area NPA1 adjacent to a lower portion of the pixel area PA. The storage line SLi may be disposed in the same layer as the gate line GLi.

The first and second branch electrodes SLa and SLb may be branched from the storage line SLi and may extend in the second direction D2 and be spaced apart from each other. The storage line SLi, which may be disposed between the first branch electrode SLa and the second branch electrode SLb. The first branch electrode SLa, and the second branch electrode SLb may be partially overlapped with the pixel electrode PE and may form the storage electrode part. The storage line SLi receives a storage voltage or a common voltage.

The pixel electrode PE, may include a trunk portion PEa and a plurality of branch portions PEb protruded and radially extending from the trunk portion PEa. The trunk portion PEa may have various shapes. For example, the trunk portion PEa may have a cross shape as shown in FIG. 2. When the trunk portion Pea has a cross shape, the pixel PXij may be divided into four domains by the trunk portion PEa.

The branch portions PEb may extend in different directions in each of the four domains. The branch portions PEb may be arranged substantially in parallel from each other and may be spaced apart from each other in each domain. Each domain may be divided by the trunk portion PEa. The branch portions PEb, which may be adjacent to each other, may be spaced apart from each other by micrometer distances to form a plurality of micro-slits.

The display panel 100 may include a liquid crystal layer interposed between two substrates facing each other. Liquid crystal molecules of the liquid crystal layer of the pixel PXij, for example, may be pre-tilted in different directions in each domain by the micro-slits. Thus, four domains having different liquid crystal alignment directions may be formed in the liquid crystal layer. A viewing angle of the display device 500 including the liquid crystal layer may be widened due to the various directions in which the liquid crystal molecules are oriented.

The pixel electrode PE may include a transparent conductive material, such as indium tin oxide (ITO), indium zinc oxide (IZO) or indium tin zinc oxide (ITZO).

A shielding electrode SHE may be disposed in the second non-pixel area NPA2. The shielding electrode SHE may extend in the second direction D2. The shielding electrode SHE may have a width in the first direction D1, which is greater than a width in the first direction D1 of the data line DLj. The shielding electrode SHE may overlap with the second non-pixel area NPA2. The shielding electrode SHE may block light passing through the second non-pixel area NPA2. The shielding electrode SHE will be described in more detail below.

The shielding electrode SHE may include a same material as that of the pixel electrode PE. In other words, the shielding electrode SHE may include the transparent conductive material, such as indium tin oxide (ITO), indium zinc oxide (IZO) or indium tin zinc oxide (ITZO).

A plurality of color filters CF, which may extend in the second direction D2, may overlap with the pixel areas PA of the pixels arranged in the second direction D2. The color filters CF may be adjacent to each other in the first direction D1. The color filters CF, which may be adjacent to each other, may overlap with each other in the second non-pixel area NPA2. The color filters CF will be described in more detail below with reference to FIGS. 4 and 5.

Figure 3:
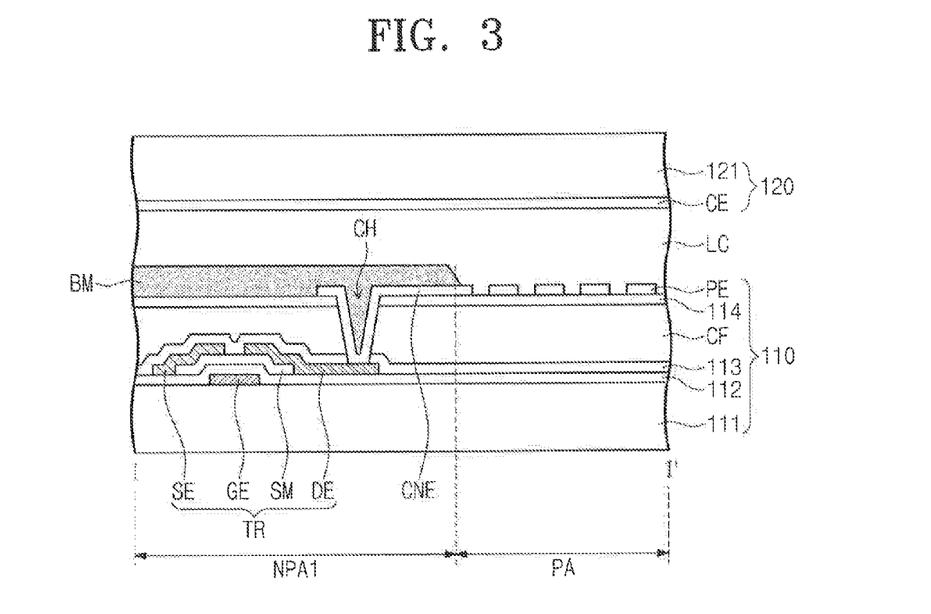
FIG. 3 is a cross-sectional view taken along a line I-I' of FIG. 2.
Figure 4:
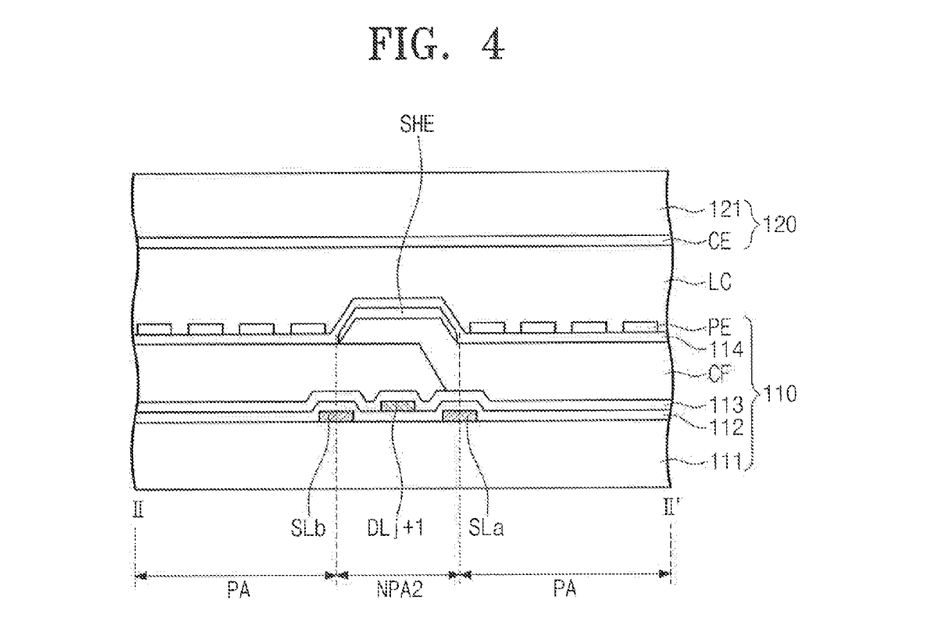
FIG. 4 is a cross-sectional view taken along a line II-II' of FIG. 2.
Figure 5:
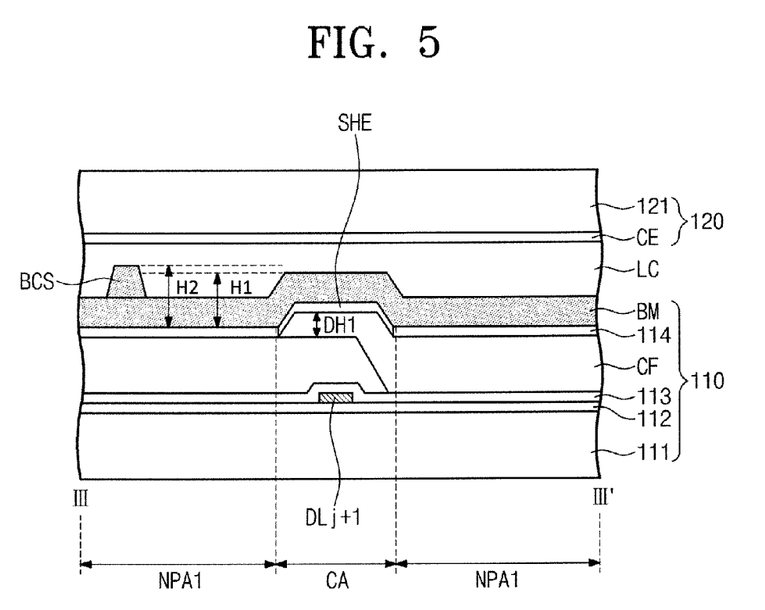
FIG. 5 is a cross-sectional view taken along a line III-III' of FIG. 2.

FIG. 3 is a cross-sectional view taken along a line I-I" of FIG. 2. FIG. 4 is a cross-sectional view taken along a line II-II' of FIG. 2. FIG. 5 is a cross-sectional view taken along a line III-III" of FIG. 2.

Referring to FIGS. 3, 4, and 5, the pixel PXij may include a first substrate 110, a second substrate 120 facing the first substrate 110, and a liquid crystal layer LC interposed between the first and second substrates 110 and 120.

The first substrate 110 may include a first base substrate 111, the transistor TR, the color filter CF, the shielding electrode SHE, the pixel electrode PE, and a black matrix BM, which may be disposed on the first base substrate 111.

The gate electrode GE of the transistor TR and the first and second branch electrodes SLa and SLb may be branched from the storage line SLi and may be disposed on the first base substrate 111. The first base substrate 111 may be a transparent or non-transparent insulating substrate. For example, the first base substrate 111 may be a silicon substrate, a glass substrate, or a plastic substrate.

A first insulating layer 112 may be disposed on the first base substrate 111 and may cover the gate electrode GE and the first and second branch electrodes SLa and SLb. The first insulating layer 112 may be a gate insulating layer. The first insulating layer 112 may be an inorganic insulating layer including an inorganic material.

A semiconductor layer SM of the transistor TR may be disposed on the first insulating layer 112 that covers the gate electrode GE. Although not shown in figures, the semiconductor layer SM may include an active layer and an ohmic contact layer.

The source electrode SE and the drain electrode DE of the transistor TR may be disposed on the semiconductor layer SM and the first insulating layer 112, and the source electrode SE and the drain electrode DE may be spaced apart from each other. A data line DLj+1 may be disposed on the first insulating layer 112 in the second non-pixel area NPA2. The semiconductor layer SM may form a conductive channel between the source electrode SE and the drain electrode DE.

A second insulating layer 113 may be disposed on the first insulating layer 112 and may cover the transistor TR and the data line DLj+1. The second insulating layer 113 may be a passivation layer. The second insulating layer 113 may be an inorganic insulating layer including an inorganic material. The second insulating layer 113 may cover an upper portion of the semiconductor layer SM, which may be exposed.

The color filters CF may be disposed on the second insulating layer 113. As described above, the color filters CF may extend in the second direction D2 and may overlap with the pixel areas PA arranged in the second direction D2. As shown in FIGS. 4 and 5, the color filters CF may be overlapped with each other in the second non-pixel area NPA2.

For example, the color filter CF disposed at a left portion of the second non-pixel area NPA2 may be disposed on the second insulating layer 113. The color filter CF disposed at a right portion of the second non-pixel area NPA2 may be disposed on the color filter CF disposed at the left portion of the second non-pixel area NPA2.

A sum of heights of the color filters CF overlapping with each other in the second non-pixel area NPA2 may be different from a height of the color filters CF disposed in the pixel area PA.

The difference in heights between the color filters CF overlapping with each other in the second non-pixel area NPA2 and the color filters CF disposed in the pixel area PA may be referred to as a first step difference DH1. In other words, the sum of heights of the color filters CF overlapping with each other in the second non-pixel area NPA2 may be greater than the height of the color filters CF disposed in the pixel area PA by the first step difference DH1.

The color filters CF may provide a color to light passing through the pixel. Each of the color filters CF may be a red color filter, a green color filter, or a blue color filter. The color filters CF may be sequentially arranged in the first direction D1 in an order of the red, green, and blue color filters. However, the arrangement of the color filters CF should not be limited thereto or thereby. In other words, the color filters CF may include a white color filter and may be arranged in various orders.

The shielding electrode SHE, which may extend in the second direction D2, may be disposed on the color filters CF in the second non-pixel area NPA2. The shielding electrode SHE may have a width in the first direction D1, which is greater than that of the data line DLj+1 in the first direction D1, and may overlap with the second non-pixel area NPA2.

A third insulating layer 114 may be disposed on the color filter CF and may cover the shielding electrode SHE. The third insulating layer 114 need not cover the shielding electrode SHE in the crossing area CA. The third insulating layer 114 may be a capping layer. The third insulating layer 114 may be an inorganic insulating layer including an inorganic material. The third insulating layer 114 may have a thickness of about 0.35 μm. As shown in FIG. 5, the third insulating layer 114 might not be disposed in the crossing area CA.

As shown in FIG. 3, the contact hole CH may penetrate through the third insulating layer 114, the color filter CF, and the second insulating layer 113 to expose a predetermined area of the drain electrode DE.

The pixel electrode PE may be disposed on the third insulating layer 114 in the pixel area PA. The connection electrode CNE may be branched from the pixel electrode PE and may be connected to the drain electrode DE of the transistor TR through the contact hole CH.

The black matrix BM may be disposed in the first non-pixel area NPA1. The black matrix BM may be disposed on the third insulating layer 114 in the first non-pixel area NPA1 except for the crossing area CA. The black matrix BM may cover the connection electrode CNE. As shown in FIG. 5, the black matrix BM may be disposed on the shielding electrode SHE in the crossing area CA.

The black matrix BM may be disposed in the crossing area CA and may have a first height H1 due to the first step difference DH1 generated by the color filters CF. The first height H1 may correspond to a height between a lower surface of the black matrix BM disposed in the first non-pixel area NPA1 and an upper surface of the black matrix BM disposed in the crossing area CA.

The black matrix BM may block light that is not used to display the image in the first non-pixel area NPA1. The black matrix BM may prevent a light leakage caused by a malfunction of liquid crystal molecules in edges of the pixel area PA adjacent to the first non-pixel area NPA1. The black matrix BM may prevent a color mixture from occurring at edges of the color filters CF disposed adjacent to the first non-pixel area NPA1.

A black column spacer BCS may be disposed on the black matrix BM in the first non-pixel area NPA1. The black column spacer BCS may include a main column spacer and a sub-column spacer. The main column spacer may be disposed in the first non-pixel area NPA1 of each pixel. The sub-column spacer may be disposed in the first non-pixel area NPA1 in every third pixel.

The main column spacer may be in contact with the second substrate 120. The main column spacer may maintain a cell gap that is defined by a distance between the first substrate 110 and the second substrate 120.

The sub-column spacer might not make contact with the second substrate 120, and the sub-column spacer may be disposed to be spaced apart from the second substrate 120 with a predetermined distance, and thus the display panel 100 may have a shock absorbing property. When the sub-column spacer is spaced apart from the second substrate 120, the fluidity of the liquid crystal in the liquid crystal layer LC may be prevented from being deteriorated. The black column spacer BCS shown in FIG. 5 may be the sub-column spacer.

The black column spacer BCS may include the same material as that of the black matrix BM. Similar to the black matrix BM, the black column spacer BCS may block light.

The black column spacer BCS may have a second height H2 that is greater than the first height H1. The second height H2 may include a height from the lower surface of the black matrix BM disposed in the first non-pixel area NPA1 to an upper surface of the black column spacer BCS.

The second substrate 120 may include a second base substrate 121 and a common electrode CE disposed under the second base substrate 121 and facing the pixel electrode PE. The second base substrate 121 may be a transparent or non-transparent insulating substrate.

The common electrode CE may include a transparent conductive material, such as indium tin oxide (ITO), indium zinc oxide (IZO) or indium tin zinc oxide (ITZO).

A backlight unit may be disposed under the display panel 100 and may supply light to the display panel 100.

The data voltage may be applied to the pixel electrode PE through the transistor TR. The common voltage may be applied to the common electrode CE. The pixel electrode PE may form an electric field with the common electrode CE by a voltage difference between the data voltage and the common voltage. The liquid crystal molecules of the liquid crystal layer LC may be driven by the electric field formed between the pixel electrode PE and the common electrode CE. A light transmittance of the liquid crystal layer LC may be controlled by the liquid crystal molecules driven by the electric field, and thus desired images may be displayed.

Although not shown in figures, the pixel PXij may include the transistor TR, a liquid crystal capacitor and a storage capacitor, which may be connected to the transistor TR. The liquid crystal capacitor may include the pixel electrode PE, the common electrode CE, and the liquid crystal layer LC disposed between the pixel electrode PE and the common electrode CE. The storage capacitor may include the pixel electrode PE, the storage line SLi and the first and second branch electrodes SLa and SLb, which may partially overlap with the pixel electrode PE.

When the liquid crystal capacitor is charged by the pixel voltage corresponding to the voltage difference between the common voltage and the data voltage, the liquid crystal molecules of the liquid crystal layer LC may be driven. The storage capacitor may supplement the pixel voltage charged in the liquid crystal capacitor.

The common voltage may be applied to the common electrode CE and the shielding electrode SHE. In other words, the common electrode CE and the shielding electrode SHE may receive the same voltage. Thus, the electric field might not be formed between the shielding electrode SHE and the common electrode CE in the second non-pixel area NPA2.

When the electric field is not formed in the second non-pixel area NPA2, the liquid crystal molecules of the liquid crystal layer LC might not be driven in the second non-pixel area NPA2, and thus, light traveling to the second non-pixel area NPA2 may be blocked by the liquid crystal molecules. As a result, the second non-pixel area NPA2 may block the light. Even though the black matrix BM might not be disposed in the second non-pixel area NPA2, light may be blocked by the shielding electrode SHE. Thus, the second non-pixel area NPA may display a black color.

The third insulating layer 114 may be disposed on the shielding electrode SHE in the crossing area CA. The height of the black matrix BM may be greater than the first height H1 and the second height H2 when a height of the third insulating layer 114 is added to the height of the black matrix BM disposed in the crossing area CA. In other words, when the third insulating layer 114 is disposed on the shielding electrode SHE in the crossing area CA, the step difference of the black matrix BM may increase.

A fluidity of the liquid crystals in the liquid crystal layer LC may deteriorate when the black matrix BM is disposed in the crossing area CA. When the black matrix BM is disposed in the crossing area CA and the black matrix BM has the height greater than the second height H2, the shock absorbing property of the display panel 100 may deteriorate.

According to an exemplary embodiment of the present invention, the third insulating layer 114 might not be disposed on the shielding electrode SHE in the crossing area CA. Thus, the black matrix BM may be disposed in the crossing area CA and may have the first height H1 lower than the second height H2 according to the height of the third insulating layer 114. For example, the black matrix BM may be disposed in the crossing area CA and may have the first height H1 smaller than the second height H2 according to the height of the third insulating layer 114 (e.g., by about 0.35 μm).

In other words, the step difference of the black matrix BM may be reduced. Thus, the black matrix BM may prevent deterioration of the fluidity of the liquid crystal molecules and may prevent deterioration of the shock absorbing property of the display panel 100.

The display device 500 according exemplary embodiments of the present invention may reduce the step difference caused by the black matrix BM, and thus the display device 500 may prevent deterioration of the fluidity of the liquid crystal and may prevent deterioration of the shock absorbing property of the display panel 100.

FIGS. 6 to 13 are views showing a manufacturing method of the display device according to an exemplary embodiment of the present invention.

FIGS. 6 to 13 show the manufacturing method corresponding to the cross-sectional view taken along lines of I-I' and III-III' of FIG. 2. The manufacturing method corresponding to the cross-sectional view of FIG. 4, which is taken along lines of II-II' of FIG. 2, will be described in more detail below.

Figure 6:
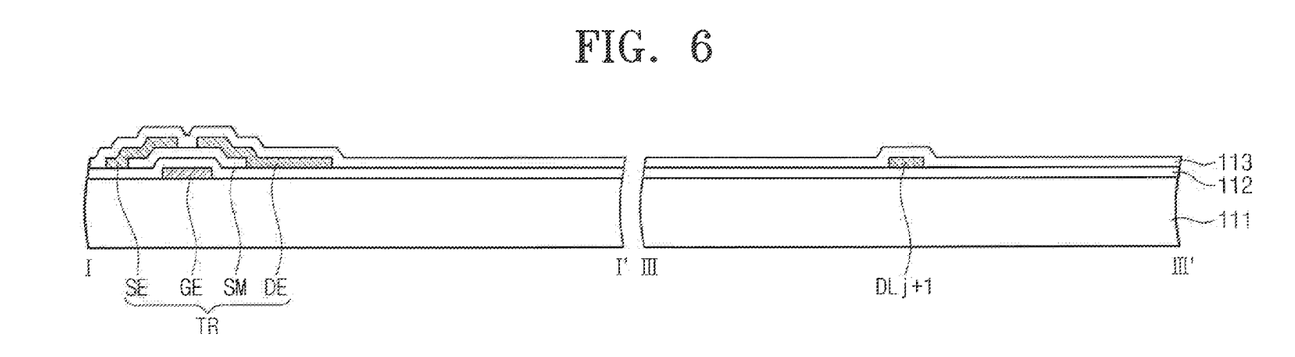
FIGS. 6 to 13 are views showing a manufacturing method of the display device according to an exemplary embodiment of the present invention.

Referring to FIG. 6, the first base substrate 111 may be prepared, and the transistor TR and the data line DLi+1 may be formed on the first base substrate 111. Although not shown in figures, the storage line SLi and the first and second branch electrodes SLa and SLb may be formed on the same layer as the gate electrode GE of the transistor TR on the first base substrate 111. The second insulating layer 113 may be formed on the first base substrate 111 and may cover the transistor TR and the data line DLj+1.

Figure 7:
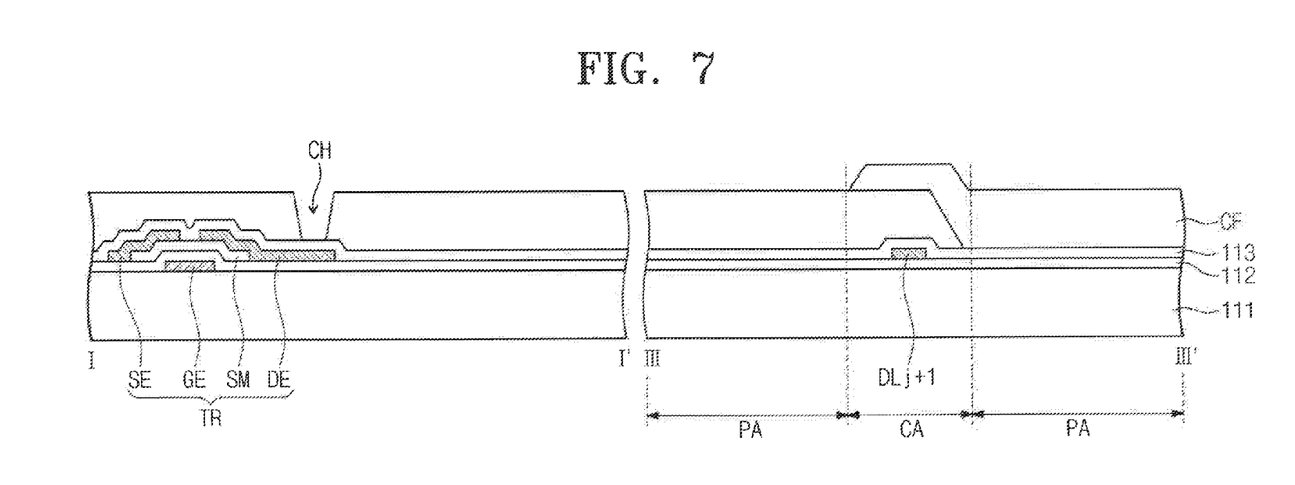

Referring to FIG. 7, the color filters CF may be formed on the second insulating layer 113. As described above, the color filters CF may extend in the second direction D2 and may overlap with the pixel areas PA arranged in the second direction D2. The color filters CF may be formed to overlap with each other in the second non-pixel area NPA2. The color filter CF disposed in the area corresponding to the contact hole CH may be removed.

The sum of heights of the color filters CF, which may overlap with each other in the second non-pixel area NPA2, may be formed to be greater than the height of the color filter CF disposed in the pixel area PA by the first step difference DH1.

Figure 8:
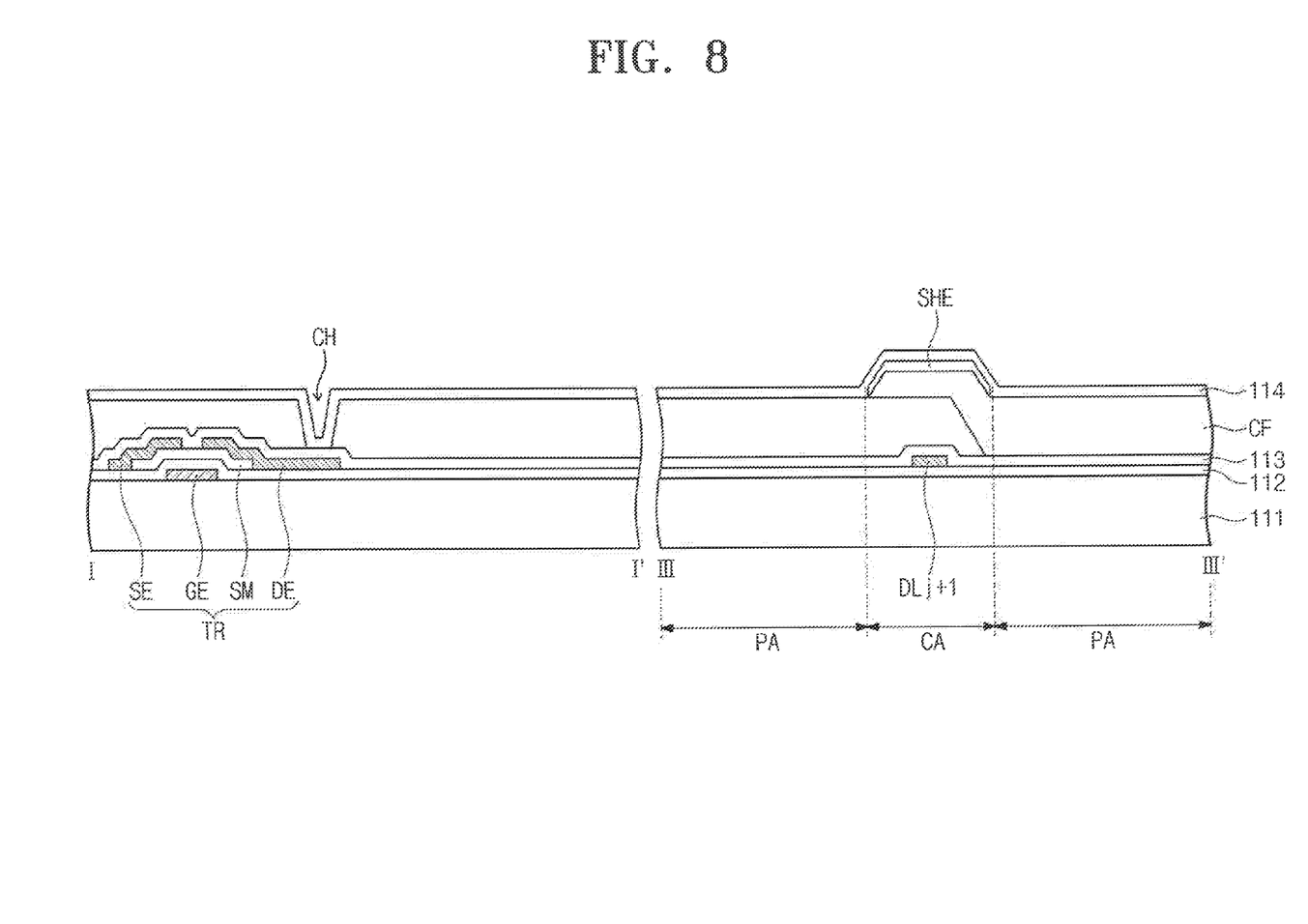

Referring to FIG. 8, the shielding electrode SHE extending in the second direction D2 may be formed on the color filters CF in the second non-pixel area NPA2. As described above, the shielding electrode SHE may have the width greater than that of the data line DLj+1, and the shielding electrode SHE may be formed to overlap with the second non-pixel area NPA2.

The third insulating layer 114 may be formed on the color filters CF and may cover the shielding electrode SHE. The third insulating layer 114 may be formed on the second insulating layer 113 and on a side surface of the color filter CF in the area corresponding to the contact hole CH.

Figure 9:
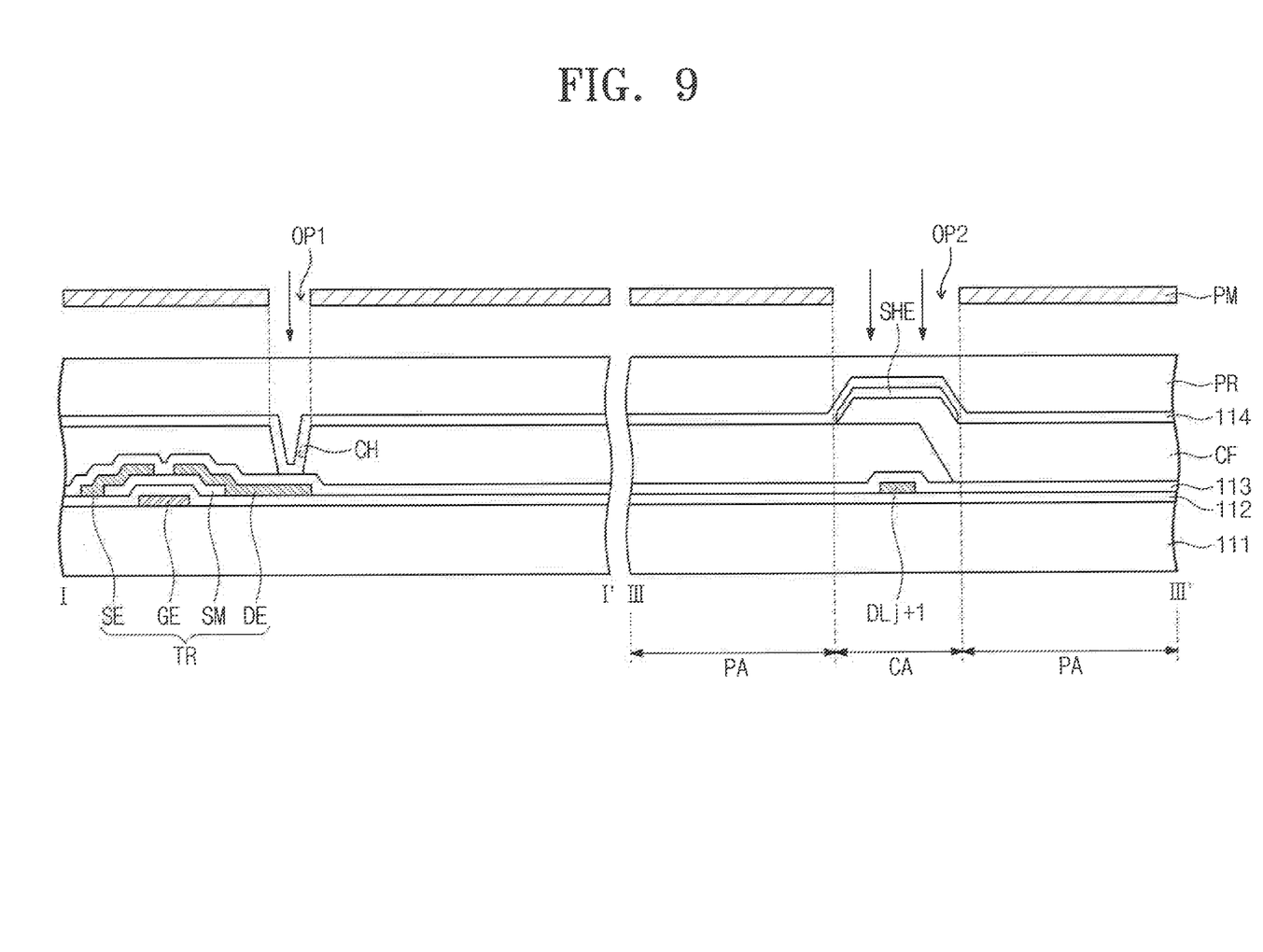

Referring to FIG. 9, a photosensitive resin PR (e.g., photoresist) may be formed on the third insulating layer 114. A photo mask PM may be disposed on the photosensitive resin PR. The photo mask PM may include a first opening OP1 formed therethrough corresponding to the contact hole CH and may include a second opening OP2 formed therethrough corresponding to the crossing area CA. The photosensitive resin PR may be exposed to light through the first opening OP1 and/or the second opening OP2 of the photo mask PM.

Figure 10:
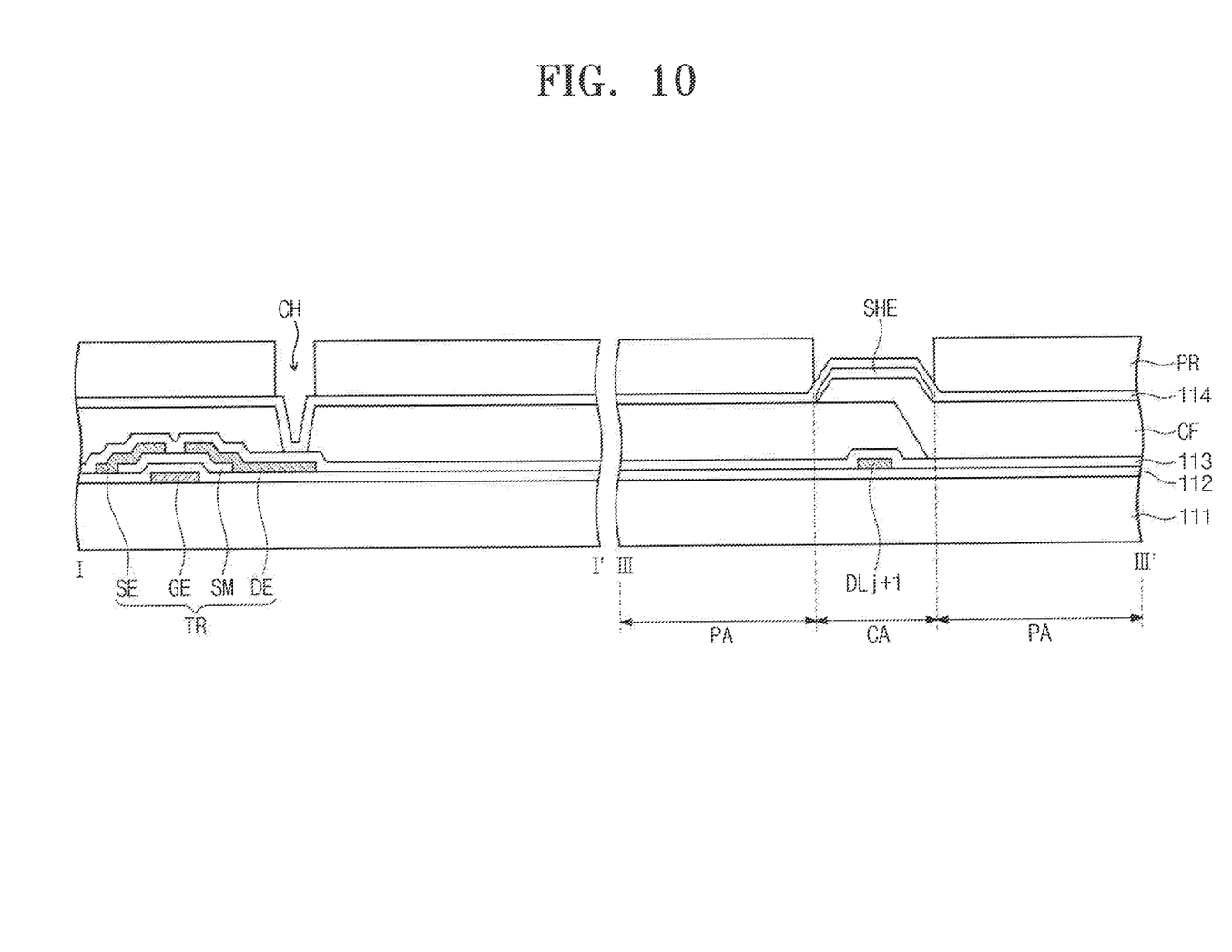

Referring to FIG. 10, the exposed photosensitive resin PR may be developed and removed. Thus, the photosensitive resin PR may be formed in the area corresponding to the contact hole CH and the crossing area CA. The photosensitive resin PR corresponding to the contact hole CH and the crossing area CA may then be removed. The third insulating layer 114 may be exposed in the area corresponding to the contact hole CH and the crossing area CA.

Figure 11:
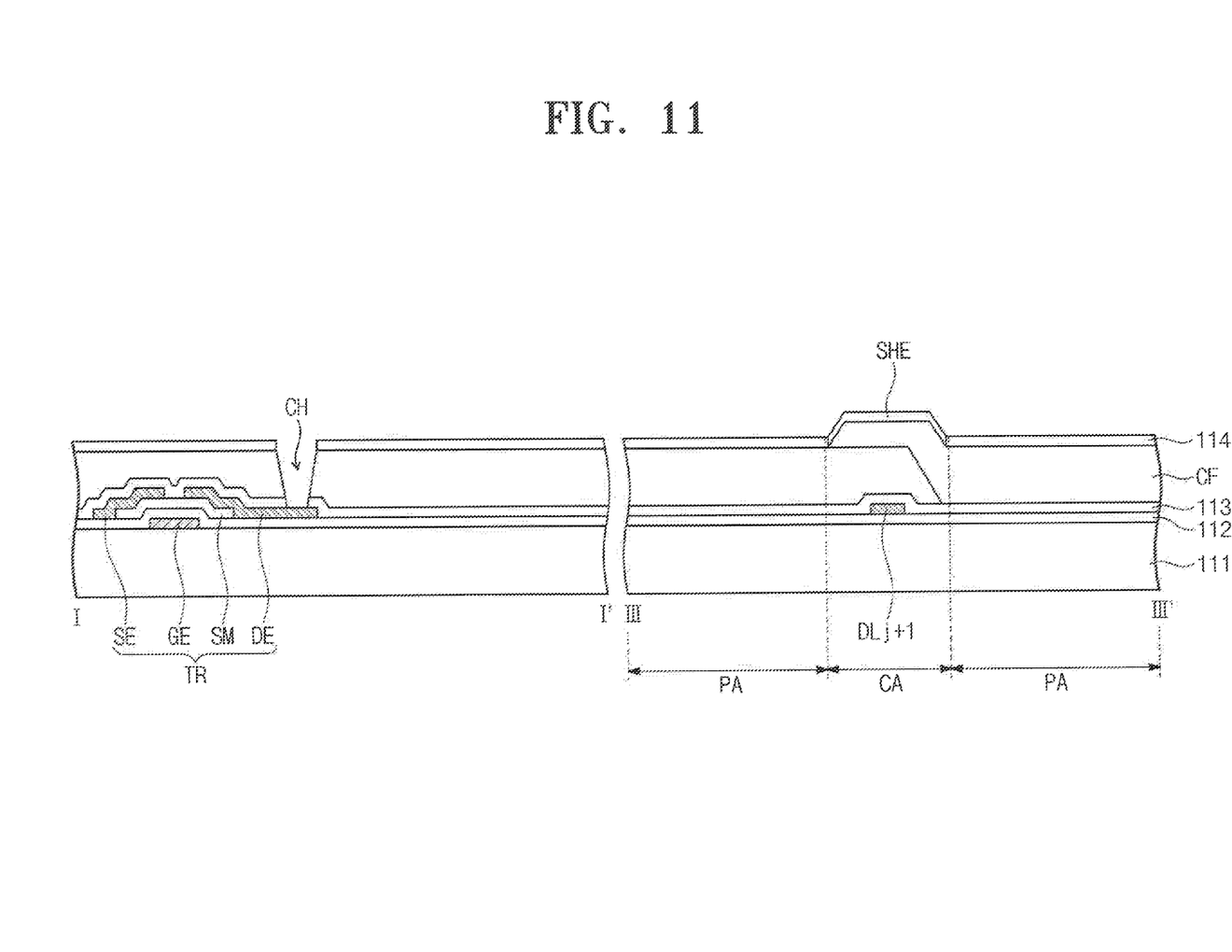

Referring to FIG. 11, the third insulating layer 114 and the second insulating layer 113 may be etched and removed in the area corresponding to the contact hole CH using the photosensitive resin PR that remains. Thus, the contact hole CH may be formed. The third insulating layer 114 may be etched and removed in the area corresponding to the crossing area CA using the photosensitive resin PR that remains.

In other words, when the third insulating layer 114 and the second insulating layer 113, which may be disposed in the area corresponding to the contact hole CH, are removed to form the contact hole CH, the third insulating layer 114 disposed on the crossing area CA may be removed. Thus, a photo mask PM need not be used to remove the third insulating layer 114.

Figure 12:
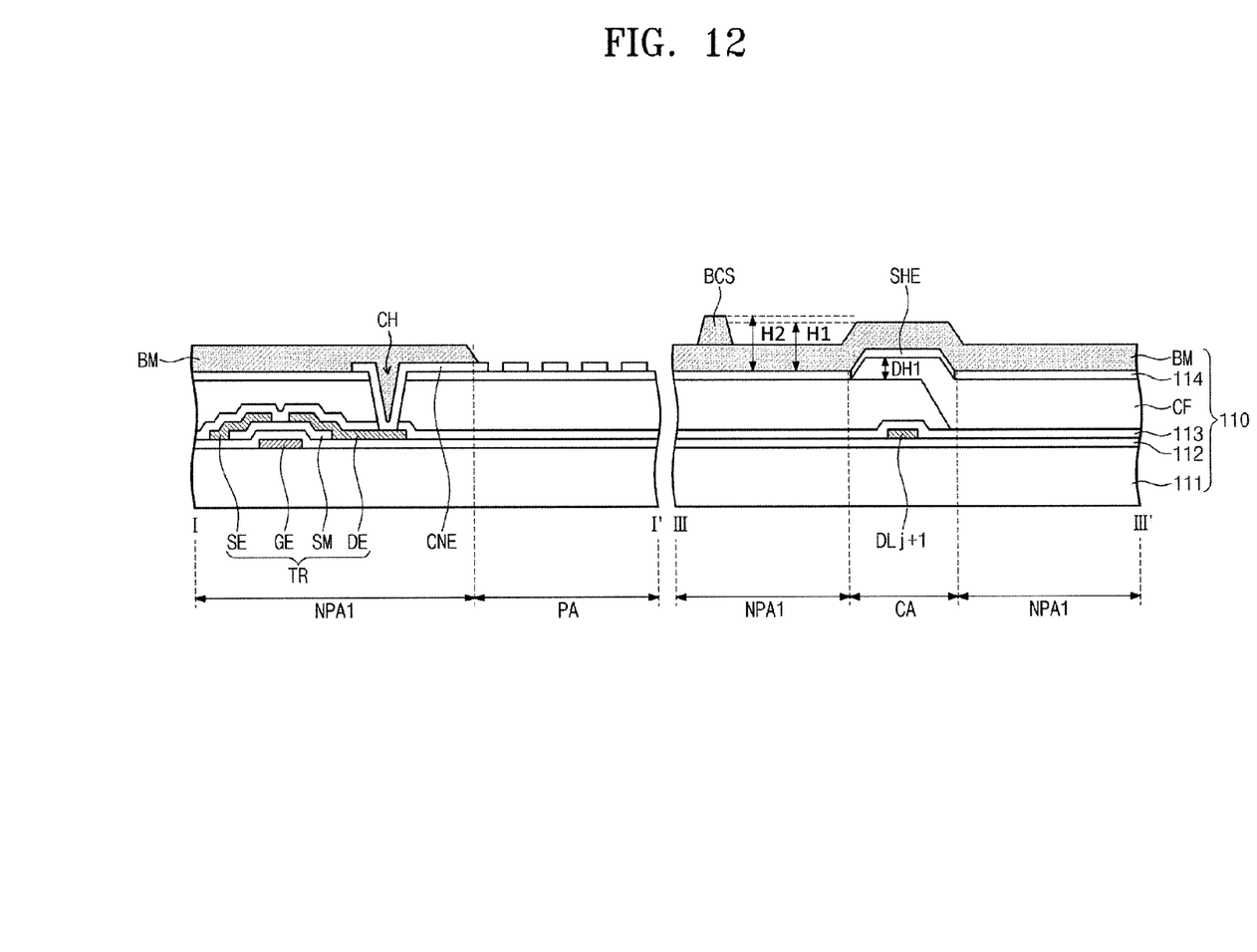

Referring to FIG. 12, the pixel electrode PE may be formed on the third insulating layer 114 in the pixel area PA. The connection electrode CNE may be branched from the pixel electrode PE. The connection electrode CNE may be connected to the drain electrode DE of the transistor TR through the contact hole CH.

The black matrix BM may be formed on the third insulating layer 114 in the first non-pixel area NPA1 except for in the crossing area CA of the third insulating layer 114. The black matrix BM may be formed on the shielding electrode SHE in the crossing area CA. As described above, the black matrix BM may be disposed in the crossing area CA and may have the first height H1 in the crossing area CA.

The black column spacer BCS may be formed on the black matrix BM in the first non-pixel area NPA1 except for the crossing area CA. The black column spacer BCS may be formed substantially simultaneously with the black matrix BM and may include the same material. The black column spacer BCS may have the second height H2 greater than the first height H1.

Figure 13:
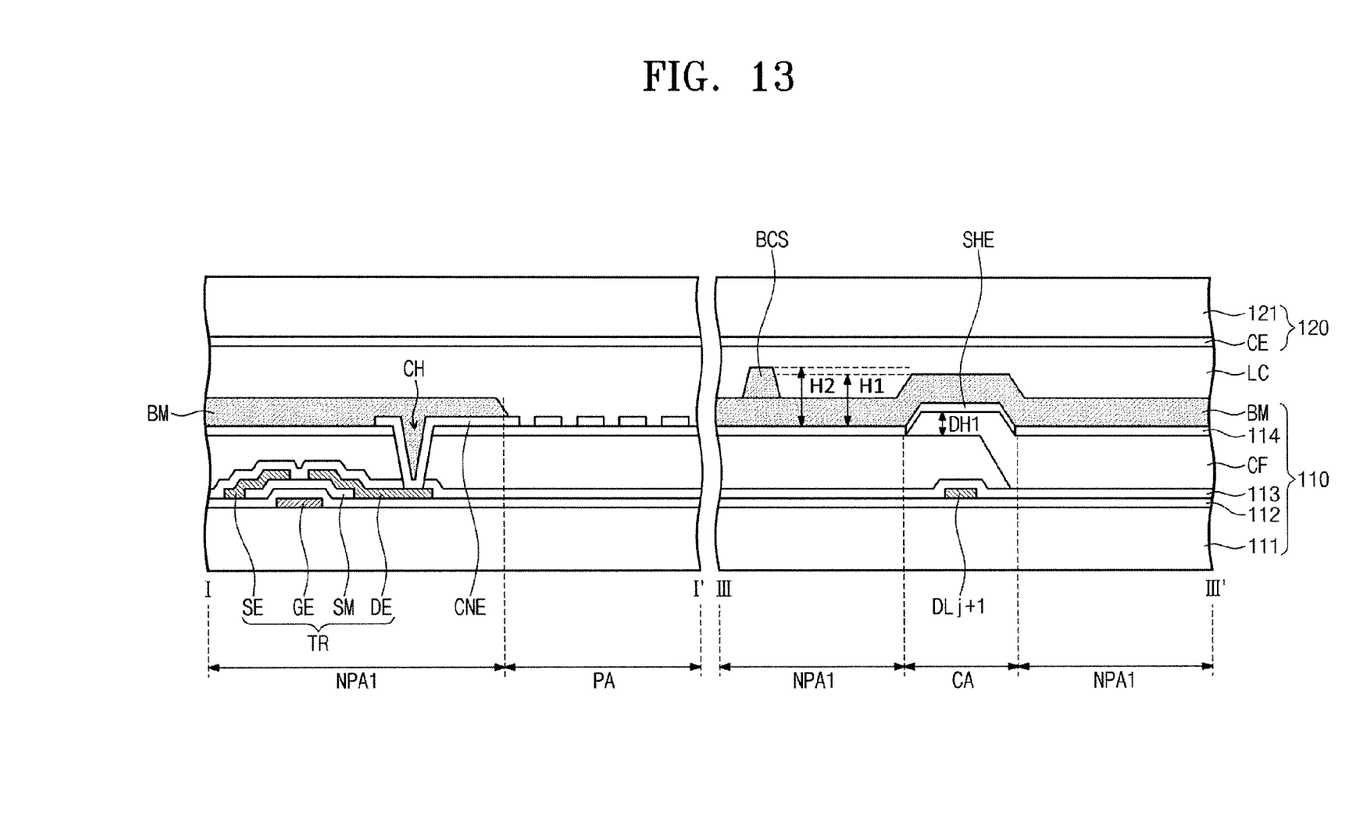

Referring to FIG. 13, the second substrate 120, which may include the common electrode CE facing the pixel electrode PE, may face the first substrate 110. The liquid crystal layer LC may be formed between the first substrate 110 and the second substrate 120, and thus the display device 500 may be formed.

According to an exemplary embodiment of the present invention, the third insulating layer 114 may be removed in the crossing area CA and might not be disposed on the shielding electrode SHE. Thus, the black matrix BM disposed in the crossing area CA may have the first height H1 smaller than the second height H2 by the height of the third insulating layer 114. When the step difference of the black matrix BM is reduced, the black matrix BM which may be disposed in the crossing area CA may prevent deterioration in fluidity of the liquid crystal and may prevent deterioration of the shock absorbing property of the display panel 100.

According to an exemplary embodiment of the present invention, the step difference of the black matrix BM may be reduced, the deterioration of the fluidity of the liquid crystal molecules may be prevented and the deterioration of the shock absorbing property of the display panel 100 may be prevented.

While the present invention has been particularly shown and described with reference to exemplary embodiments thereof, it will be understood by those of ordinary skill in the art that various changes in form and detail may be made therein without departing from the spirit and scope of the present invention, as defined by the following claims.

What is claimed is:

1. A display device, comprising:
a plurality of pixels, at least one of the pixels including a pixel area, a first non-pixel area disposed adjacent to the pixel area and extending in a first direction, and a second non-pixel area extending in a second direction substantially perpendicular to the first direction, at least one of the pixels comprising:
a pixel electrode disposed in the pixel area;
a color filter;
a shielding electrode extending in the second direction, wherein the shielding electrode is disposed in the second non-pixel area on the color filter;
an insulating layer disposed on the color filter, wherein the insulating layer covers the shielding electrode in an area except for a crossing area where the first non-pixel area crosses the second non-pixel area; and
a black matrix disposed on the insulating layer in the first non-pixel area and on the shielding electrode in the crossing area.

2. The display device of claim 1, wherein the color filter overlaps with an adjacent color filter in the second non-pixel area.

3. The display device of claim 2, wherein a sum of heights of the overlapping color filters is greater than a height of the color filter extending in the second direction by a first step difference.

4. The display device of claim 3, further comprising a black column spacer disposed on the black matrix in the first non-pixel area except for the crossing area, wherein the black matrix disposed in the crossing area has a first height by the first step difference, and the black column spacer has a second height greater than the first height.

5. The display device of claim 1, further comprising:
a transistor connected to the pixel electrode;
a gate line extending in the first direction, wherein the gate line is disposed in the first non-pixel area, and connected to the transistor;
a data line extending in the second direction, wherein the data line is disposed in the second non-pixel area, and is connected to the transistor; and
a contact hole penetrating through the color filter and the capping layer, wherein the color filter is disposed on the transistor, the pixel electrode is disposed on the capping layer, and the pixel electrode is connected to the transistor through the contact hole.

6. The display device of claim 5, wherein the shielding electrode has a width in the first direction, which is greater than a width of the data line, and overlaps with the second non-pixel area.

7. The display device of claim 1, wherein the insulating layer has a thickness of about 0.35 μm.

8. The display device of claim 1, further comprising:
a first substrate on which the pixels are disposed;
a second substrate facing the first substrate, wherein the second substrate includes a common electrode facing the pixel electrode; and
a liquid crystal layer interposed between the first substrate and the second substrate.

9. The display device of claim 8, wherein the shielding electrode receives a same voltage as a voltage applied to the common electrode.

10. The display device of claim 8, wherein the pixel electrode, the shielding electrode, and the common electrode comprise a transparent conductive material.

11. A method of manufacturing a display device, comprising:
forming a plurality of pixels, at least one of the pixels including a pixel area, a first non-pixel area disposed adjacent to the pixel area and extending in a first direction, and a second non-pixel area extending in a second direction substantially perpendicular to the first direction, the at least one pixel being formed by:
forming a color filter;
forming a shielding electrode extending in the second direction and disposed on the color filter in the second non-pixel area;
forming an insulating layer on the color filter covering the shielding electrode;
removing the insulating layer in a crossing area in which the first and second non-pixel areas cross each other;
forming a black matrix on the insulating layer in the first non-pixel area and on the shielding electrode in the crossing area; and
forming a pixel electrode on the insulating layer in the pixel area.

12. The method of claim 11, wherein the color filter overlaps with an adjacent color filter in the second non-pixel area.

13. The method of claim 12, wherein a sum of heights of the color filters, which overlap with each other in the second non-pixel area, is greater than a height of the color filter disposed in the pixel area by a first step difference.

14. The method of claim 13, further comprising forming a black column spacer on the black matrix in the first non-pixel area, wherein the black column spacer is formed substantially simultaneously with the black matrix using a same material as the black matrix, the black matrix disposed in the crossing area has a first height by the first step difference, and the black column spacer has a second height greater than the first height.

15. The method of claim 11, further comprising:
forming a transistor connected to a gate line, a data line, and the pixel electrode; and
forming a contact hole through the color filter and the capping layer, wherein the gate line extends in the first direction and is formed in the first non-pixel area, the data line extends in the second direction and is formed in the second non-pixel area, the color filter is formed on the transistor, and the pixel electrode is connected to the transistor through the contact hole.

16. The method of claim 15, wherein the shielding electrode has a width in the first direction, which is greater than a width of the data line in the first direction, and the shielding electrode overlaps with the data line in the second non-pixel area.

17. The method of claim 11, wherein the capping insulating layer has a thickness of about 0.35 μm.

18. The method of claim 11, further comprising:
forming a liquid crystal layer between a first substrate and a second substrate, wherein the pixels are formed on the first substrate and a common electrode is formed on the second substrate.

19. The method of claim 18, wherein the pixel electrode, the shielding electrode, and the common electrode comprise a transparent conductive material.

* * * * *